United States Patent [19]
Staffiere

[11] Patent Number: 6,137,671
[45] Date of Patent: Oct. 24, 2000

[54] EMBEDDED ENERGY STORAGE DEVICE

[75] Inventor: Donald T. Staffiere, Amherst, N.H.

[73] Assignee: Energenius, Inc., Canada

[21] Appl. No.: 09/015,735

[22] Filed: Jan. 29, 1998

[51] Int. Cl.[7] .......................... H01G 4/005; H01G 4/018
[52] U.S. Cl. ...................... 361/311; 361/303; 361/301.4; 361/750; 361/763
[58] Field of Search .............................. 361/301.1, 301.2, 361/301.4, 303, 750, 763, 764, 311, 312, 313, 320, 321.1, 321.2, 321.3, 321.4, 321.5, 328–330

[56] References Cited

U.S. PATENT DOCUMENTS

| | | | |
|---|---|---|---|
| Re. 35,064 | 10/1995 | Hernandez | 361/763 |
| 3,644,853 | 2/1972 | Ma | 384/15 |
| 4,890,192 | 12/1989 | Smith | 761/328 |
| 4,994,936 | 2/1991 | Hernandez | 361/306 |
| 5,019,468 | 5/1991 | Miyabayashi | 429/191 |
| 5,027,253 | 6/1991 | Lauffer et al. | 361/321 |
| 5,086,370 | 2/1992 | Yasaitis | 361/313 |
| 5,114,780 | 5/1992 | Mercer et al. | 428/195 |
| 5,161,086 | 11/1992 | Howard et al. | 361/321 |
| 5,161,304 | 11/1992 | Queyassac et al. | 29/827 |
| 5,162,977 | 11/1992 | Paurus et al. | 361/401 |
| 5,172,304 | 12/1992 | Ozawa et al. | 361/401 |
| 5,180,645 | 1/1993 | More | 429/127 |
| 5,289,034 | 2/1994 | Hundt | 361/392 |
| 5,469,324 | 11/1995 | Henderson et al. | 361/301.2 |
| 5,473,191 | 12/1995 | Tanaka | 257/680 |
| 5,583,739 | 12/1996 | Vu et al. | 361/313 |
| 5,828,106 | 10/1998 | Sato | 257/350 |
| 5,831,810 | 11/1998 | Bird et al. | 361/301.1 |

FOREIGN PATENT DOCUMENTS

| | | | |
|---|---|---|---|
| 0713358A2 | 5/1996 | European Pat. Off. | H05K 1/16 |
| 3837206A1 | 5/1990 | Germany | H05K 9/00 |
| 03167887 | 7/1991 | Japan | H05K 1/05 |
| WO92/19090 | 10/1992 | WIPO | H05K 1/16 |
| 98/07167 | 2/1998 | WIPO | H01G 4/12 |

OTHER PUBLICATIONS

Webster's Collegiate Dictionary 10 th edition, p. 168, 1993.

*Primary Examiner*—Kristine Kincaid
*Assistant Examiner*—Eric W. Thomas
*Attorney, Agent, or Firm*—Locke Liddell & Sapp LLP

[57] ABSTRACT

The present invention is directed towards an embedded electrical storage device in a layered electrical device, such as a printed circuit board or integrated circuit chip. An electrical energy storage device, having an outer surface, is embedded in the layered electrical device, either partially or fully is formed of at least two electrical conducting layers sandwiching a high capacity dielectric, and is connected to other circuitry on the layered electrical device. This arrangement may be used in numerous applications including use as storage and filter capacitors for power conditioning.

56 Claims, 8 Drawing Sheets

EMBEDDED ENERGY STORAGE DEVICE

The present invention is directed to the formation of energy storage devices on layered electrical devices, including printed circuit boards, chips, and other electrical devices made in layers.

BACKGROUND OF THE INVENTION

Usually, the volume consumed by a layered electrical device or assembly, such as a printed circuit board, or integrated circuit chip, is a very valuable commodity in the design of an electronic assembly device. The volume of the assembly dictates the number, size, and placement of components on it. In addition, with the advent of personal computers, a major limitation is in the space available for components to exist above the actual device surface. For example, minimization of the space used above the actual device represents a minimization of volume used for a system of printed circuit boards connected to a common bus, and thus maximizing the use for that volume.

The area of a surface consumed by mounted devices on a circuit board is also a very valuable commodity. Therefore, to reduce the surface area used by a mounted device lets the designer use that much more surface area for additional functional devices. Specifically, if one could redesign a circuit board with all the electric storage devices embedded within the board, a designer could use much more surface area for additional functional devices on that circuit board. Or, the designer could reduce the entire assembly size.

Similarly, if an integrated circuit chip (IC chip) could embed smaller, more powerful electric storage devices within the layers making up the chip, more volume of the chip could be dedicated to other functional purposes.

Typically, in a printed circuit board, the design of the circuitry requires some sort of energy storage device, such as a capacitor or battery. The designer usually chooses a discrete component for such a storage device in the circuit. This discrete component occupies surface area of the board and an amount of volume in and above the board.

During the printed circuit board manufacturing process, the spot where the energy storage device is to be placed is left blank for attachment later. Usually, a manufacturer manufactures the circuit board with holes placed where the leads of the storage device will be attached. Later, a discrete electrical storage device, such as a battery or capacitor, is placed into the circuit and electrically attached to the circuit board with a secondary interconnection such as a screw on contact or soldered joint. Usually, the circuit connections are terminated at the hole where the storage device leads will be placed, and when the storage device leads are guided into the hole, this completes the circuit path.

However, using discrete electrical storage device components has several drawbacks. One main drawback is that most of the electrical storage device components and the necessities for their connection to the circuit take up valuable surface area on and occupy volume in and above the board.

With respect to IC chips, large electrical storage devices are impracticable. First, usually an IC chip usually does not have any interconnections to discrete devices through its surface. Second, the small volume of a chip does not lend itself to large or medium electrical storage devices.

Generally, capacitors in particular require large areas and volumes, and tend to tower above other components on a board. Even smaller capacitors on a circuit board can be the tallest components on a board. Capacitors present design problems due to placement, and take up valuable board surface area and volume.

The equation $(k \times A)/T$ defines the capacitance of an energy storage device, or a measure of the amount of electric charge it can hold. In the equation, k stands for the dielectric constant of the material between two opposite charged plates, A being the area of the smallest plate, and T being the thickness of the dielectric material. Thus, small volumes and areas, without a high dielectric constant, make smaller capacitances. For very small volumes and areas, such as in an IC chip, large storage devices are impracticable due to space limitations and the fact that most IC chips do not provide for a surface interconnection to other discrete components.

If a design requires a larger capacitor in a particular, the problem is amplified further. A larger capacitor tends to require a larger area and volume to house the discrete component. Usually, for printed circuit boards, the solution is to place the capacitors where they extend outward from the board.

An example of the space needed for capacitance can be shown in the context of a power supply, where capacitors can take up about 30% of a board's space.

Another problem exists when the discrete storage device must be interconnected into the circuit board. Usually, a manufacturer must solder all components into a connection to the circuit in the printed circuit board. This interconnection is a weak point and the cause of many failures in printed circuit board packages. The interconnection is also a point where manufacturing mistakes can occur. Thus, an energy storage device integrated directly into the layers of a layered electrical device, such as a printed circuit board or IC chip, is very valuable.

In an integrated circuit chip, the spaces involved are so small that significant capacitance or energy storage is not possible. The only place to put any energy storage device is in the substrate comprising the integrated circuit chip. Thus significant energy storage, as a battery or capacitor, is untenable for these devices.

What is needed is an apparatus in which the energy storage device components do not take up area on the surface of and volume above a layered electrical device. If this could be achieved, this would free up valuable area for the placement of components and free up the volume used by discrete components. In addition, an integrated electrical energy storage device formed in the substrates of an IC chip could greatly enhance the functionality of that chip. Further, an integrated energy storage device in a layered electrical device is needed to enhance semiconductor performance, since it eliminates some soldered connections.

SUMMARY OF THE INVENTION

The current invention involves an apparatus by which the energy storage device components do not take up area or volumes on the surfaces on a layered electrical device such as an IC chip or printed circuit board. The current invention serves to reduce the volume used for electrical energy storage devices within a layered electrical device such as an IC chip or printed circuit board.

In a preferred embodiment, the layered electrical device manufacturer embeds the energy storage device in the strata that make up the layered electrical device. A high energy storage dielectric is sandwiched between two electrical conducting layers and is contained completely within the layered electrical device. At least one of the electrical conducting layers around the high storage dielectric is etched or formed to the parameters necessary to establish the value for the energy storage device. A manufacturer etches or forms the layer according to the technologies inherent in the semiconductor device processes, integrated chip manufacturing techniques, or printed circuit board techniques.

In a preferred embodiment, a manufacturer makes up the layered electrical device of from layers or substrates. The layered electrical device would contain in its assembly a pair of electrical conducting layers sandwiching a high energy storage capacity dielectric. The first conducting layer would be formed to provide the appropriately shaped and sized plate for the electrical storage device, such as a battery or capacitor.

In one alternative, second conducting layer would remain unchanged. Here, all the energy storage devices defined by the two conducting layers and the dielectric layer would need a similar voltage level at the lead defined by the second conducting layer.

In another embodiment, the areas in the second conducting layer would be electrically isolated from one another. This would serve to form independent leads for each energy storage device defined by the two conducting layers and the dielectric layer. A designer could make appropriate connections to several different voltages for each energy storage device from the now independent leads.

In yet another embodiment, one conducting layer could also act as a thermal heat sink for the layered electrical device.

The dielectric should have a dielectric constant of at least 50, and preferably one of at least 100.

Thus, a designer or manufacturer may form high energy storage capacitors and batteries internally to the chip or board. This internal manufacturing reduces interconnections, a root of many manufacturing flaws. The high capacity dielectric also gives the capability for higher capacity capacitors and batteries internal to a layered electrical device, thus freeing up valuable area and volume on and in a layered electrical device.

DETAILED DESCRIPTION OF THE INVENTION

The current invention describes an apparatus by which energy storage devices is integrated into a layered electrical device, such as an IC chip or printed circuit board, without the need for secondary interconnections. Thus the energy storage device need not be a separate discrete device formed apart from the layered electrical device and added at a later manufacturing stage. Instead, a manufacturer would form the energy storage device as an integral part of a layered electrical device. Secondly, the energy storage device takes a minimum of area on the surface and volume of a layered electrical device.

Figure 1:
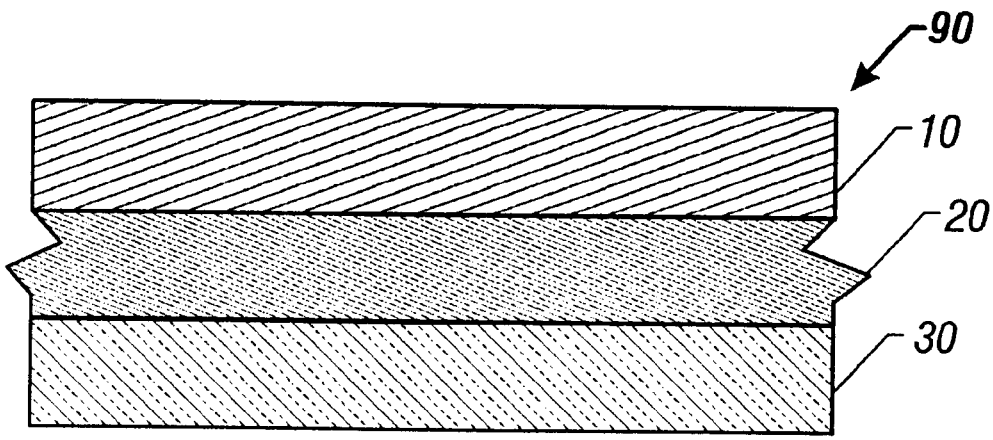
FIG. 1 is a cut away view of an integrated circuit chip.
Figure 2:
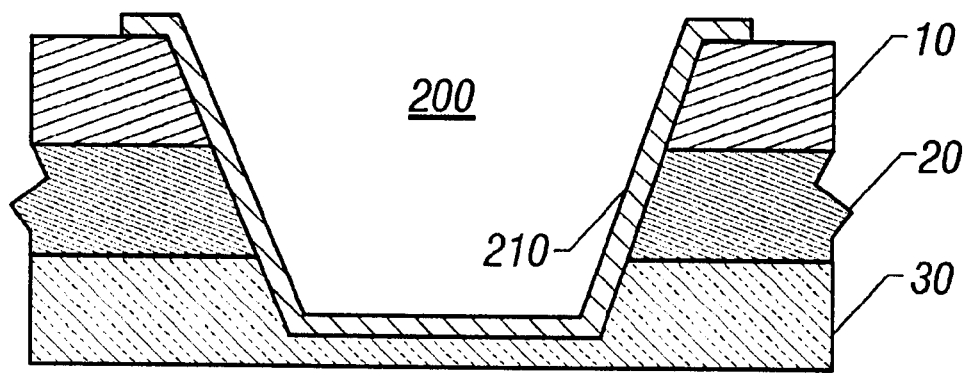
FIG. 2 is a cut away view of an electrical connection between the layers of an integrated circuit chip.

As shown in FIG. 1, an integrated circuit chip 90 is made with layers of conducting 10, non-conducting 20, and semi-conducting 30 materials. Circuits are formed in the chip by forming channels 200, called "vias", in the substrates, as shown in FIG. 2. These channels may be carved using mechanical etching, x-ray lithography, or many other processes well known in the art. Laying down thin films of an electric conductor 210 electrically connects the vias to another layer. Further, to maximize the volume used, many layered electrical devices are formed in layers and bonded together to form the final product.

All energy storage devices, such as capacitors, may not have high energy storage capability, due to the limited volume of the materials and the low dielectric constants of most materials used in the chip. Thus, because of area and volume limitations, designing a layered electrical device with energy storage devices capable of storing a significant amount of energy is impracticable. Further, in most integrated circuit chips, no energy storage device can reside above it, as with a printed circuit board having external connections for discrete devices. This is because an integrated circuit chip usually does not allow for interconnections on the surfaces of the chip.

Figure 3:
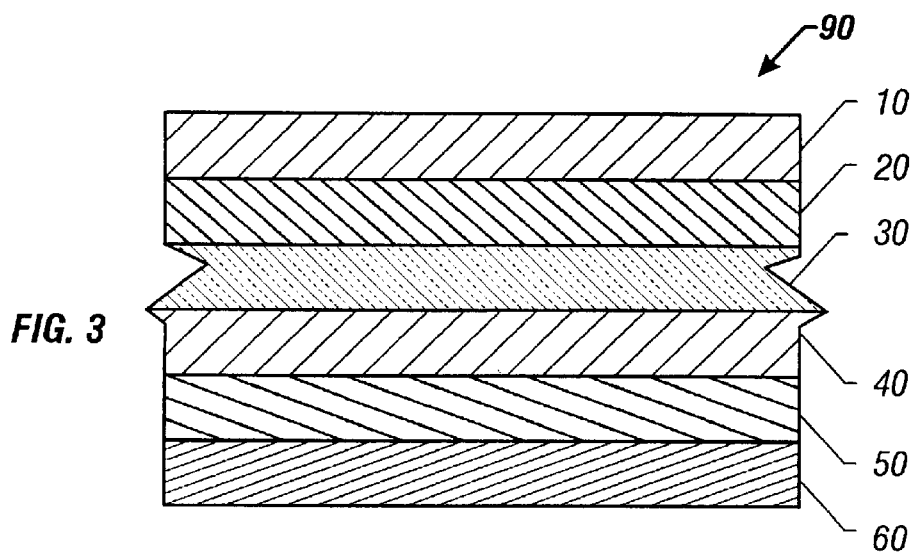
FIG. 3 is a cut away view of the stratums making up an integrated circuit chip of the invention.

In an embodiment of the invention, shown in FIG. 3, an integrated circuit chip 90 contains additional substrates 40, 50, and 60. These substrates comprise a high storage capacity dielectric material 50 sandwiched between two electric conducting substrates 40 and 60.

Figure 4:
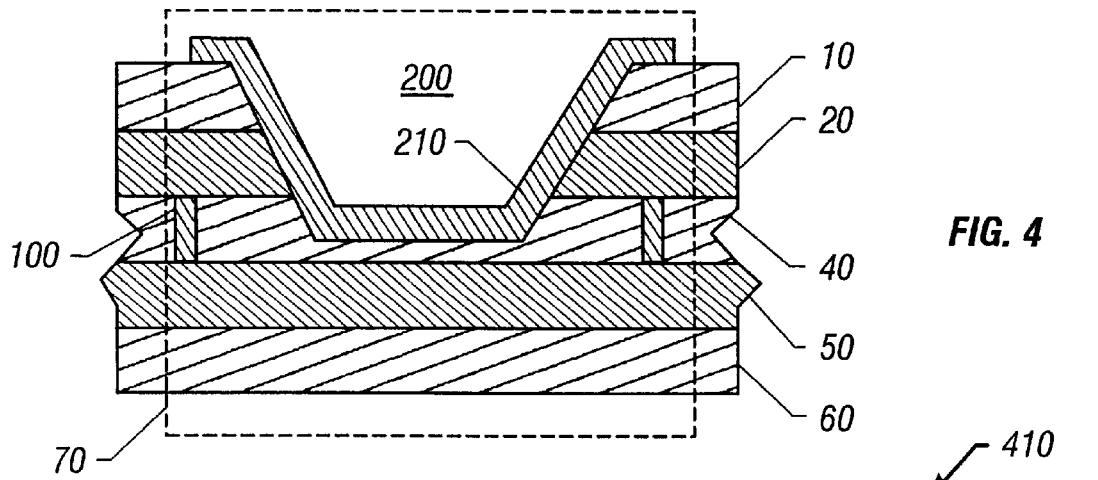
FIG. 4 is a cut away view of an electrical storage device on an integrated circuit chip according to the invention.

Referring to FIG. 4, to form an energy storage device such as capacitor 70 in the layered assembly, one needs only to figure out the proper capacitance required. With a given dielectric material, and the material having a known thickness, one only needs compute the area of conducting substrate 40 to define and form conducting plate 100 that corresponds to the required energy storage or capacitance.

Figure 4A:
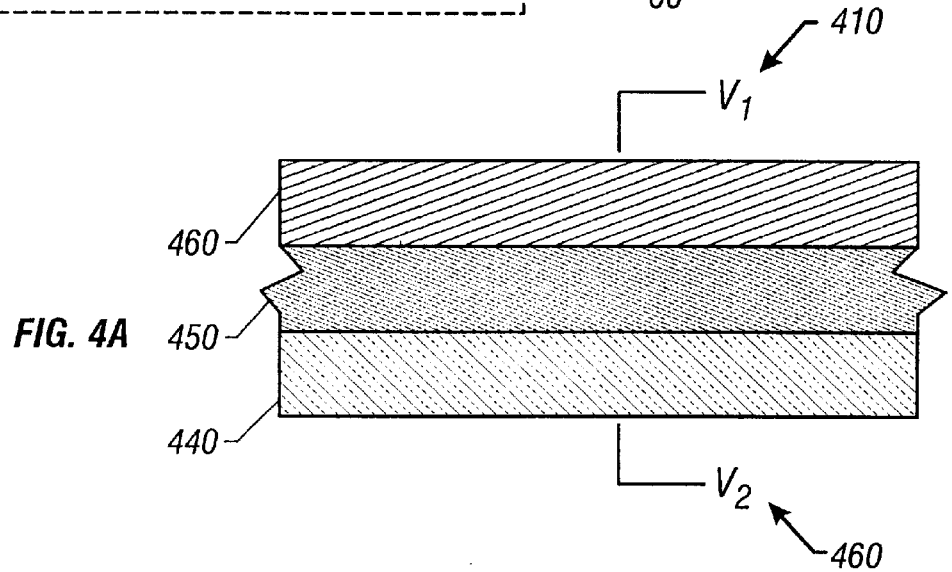
FIG. 4a is a cut away view of a classical electrical energy storage device.

The structure of a classic capacitor is shown in FIG. 4a, and comprises two electrical conducting plates 460 and 440 sandwiching a dielectric layer 450. Electrical conducting layers 460 and 440 are connected to voltages 410 and 460. It should be noted that capacitor 70 in FIG. 4 may have this structure. If a voltage is applied to layer 10, and a voltage applied to layer 60, the full capacitor structure is present. It should be further noted that one can easily apply this same layered structure to implement a battery as well.

Figure 5:
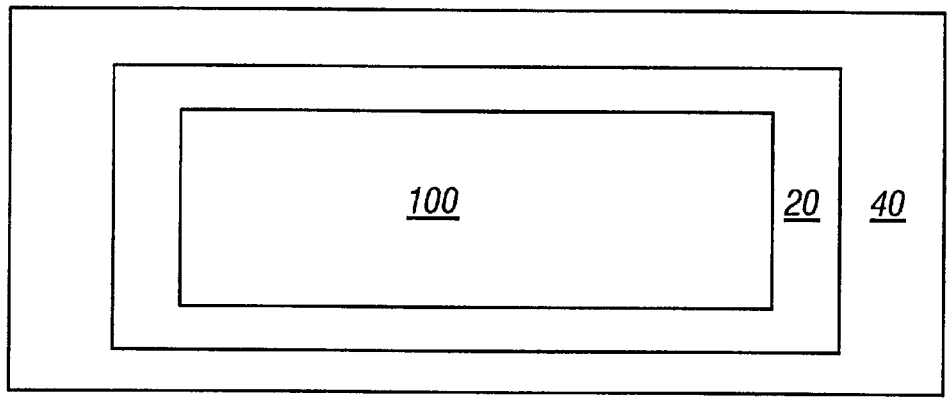
FIG. 5 is a cut away planar view of the bottom of the formation of a conducting plate according to the invention.

To make an energy storage device according to the invention, the designer or manufacturer determines a proper spot for where the electric storage device 70 is to reside, and conducting plate 100 is electrically isolated from the rest of substrate 40, as shown in FIGS. 4 and 5. "Via" 200 then electrically connects substrate 40 to substrate 10. This forms a capacitor embedded within a layered electrical device as shown in FIG. 5 using substrates 40, 50, and 60.

Figure 6:
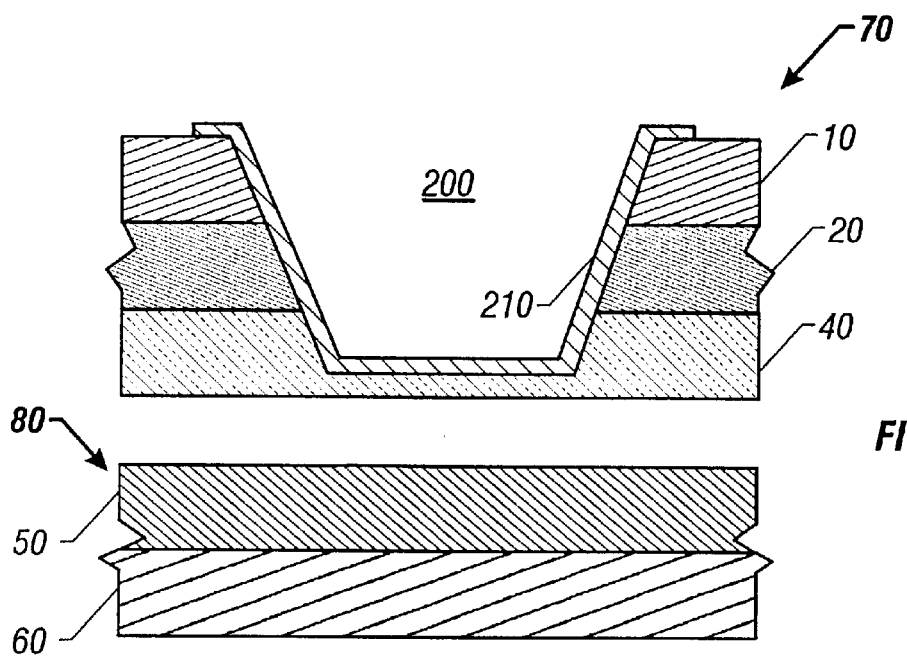
FIG. 6 is a cut away side view of an embodiment of the invention on an integrated circuit chip.
Figure 7:
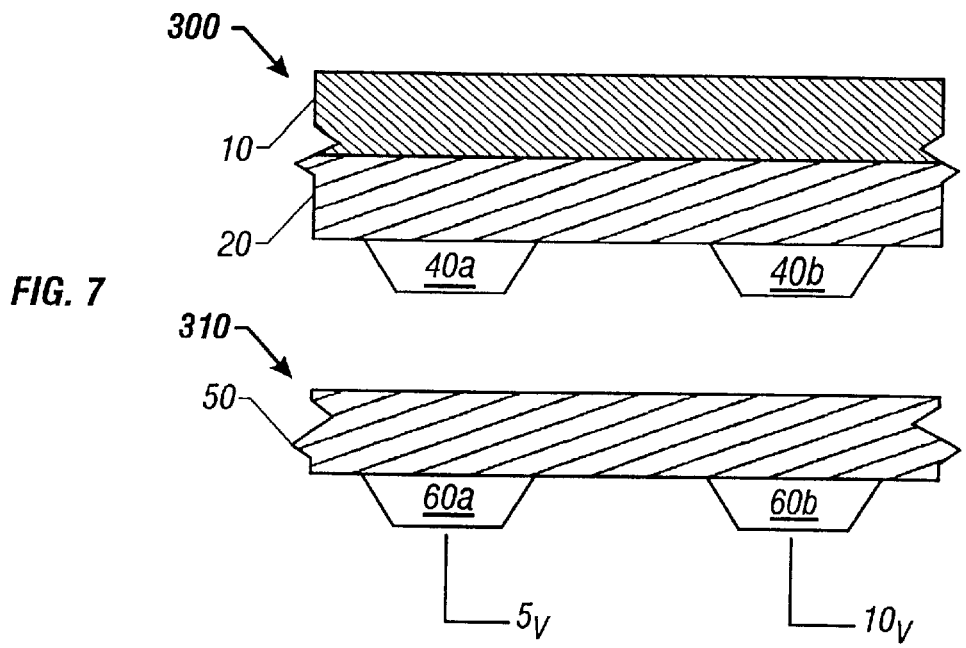
FIG. 7 is a cut away view of another embodiment of the invention on an integrated circuit chip.

FIGS. 6 and 7 show one alternative for forming the invention. Substrate 40 is initially formed on substrate 20, and altered via conventional chip making techniques for the proper size, shape, and position, and ready to be bonded to a wafer 80 of dielectric material 50 and electrical conducting layer 60. A practitioner can do this by any way known in the prior art. In one embodiment of the invention shown in FIG. 7, one preforms substrate 60 so that each electrically segregated area on substrate 60, 60a and 60b, can connect to different voltages. Alternatively, as shown in FIG. 6, one need not alter substrate 60. Here one could tie each capacitor or other energy storage device to the same voltage level via substrate 60.

Figure 8:
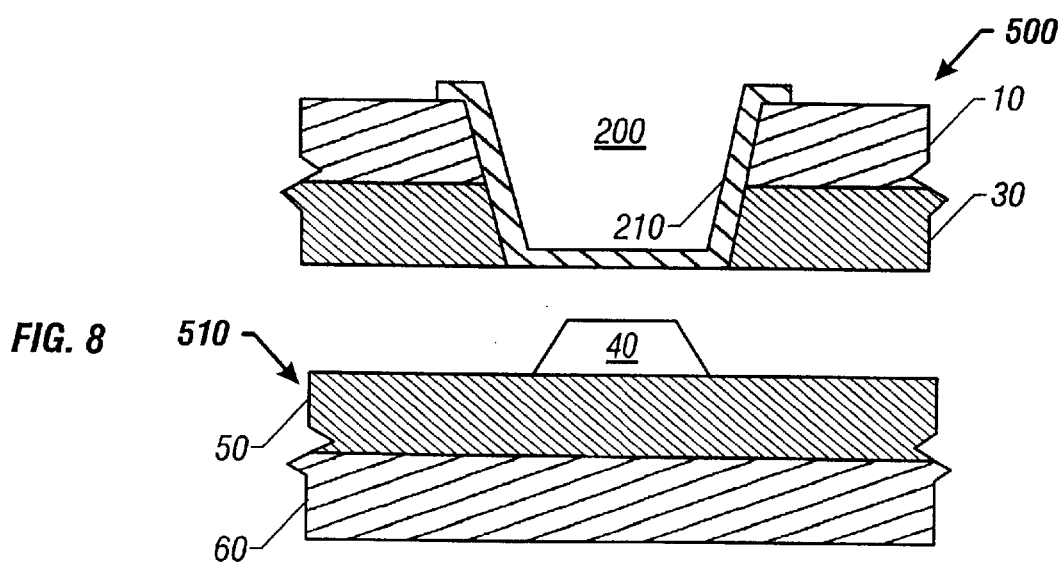
FIG. 8 is a cut away view of another embodiment of the invention on an integrated circuit chip.

Or, as shown in FIG. 8, one could form substrates 40, 50, and 60 as a unit. One then alters substrates 40 and 60 for the proper size, shape, and position, and then bonds these to chip 90 via conventional integrated circuit chip manufacturing techniques. One should note that one need not etch layers 40 and 60 down off of dielectric layer 50. One could build these layers up on dielectric layer 50 in the proper shape, size, position, and area. After bonding together subparts 500 and 510, making "via" 200 would form the electrical connection between electric conducting substrates 10 and 40 as described previously. One should note that via 200 may be made previously to bonding. This would then connect the electric storage device to the rest of the circuit.

In another embodiment, one could reduce the thickness of the dielectric material 50 in FIG. 7 via conventional chip making techniques, thus increasing capacitance in a resulting capacitor.

It is crucial that the dielectric constant of dielectric material 50 is as high as possible to reduce the area needed for an electric conductor. The dielectric material should have a dielectric constant of at least 50, and preferably should be at least 100 or better. Having this high storage capacity for is crucial for two reasons. First, one can form small and medium sized energy storage devices with a least amount of area and use volume within a layered electrical device. Second, for higher order energy storage devices, until now not realizable with prior art materials on an integrated circuit chip, higher electric storage capacity is necessary. One easily achieves a higher electric storage capacity with a composition having a higher dielectric constant. The higher the dielectric constant, the more energy storage and capacitance a given conducting plate 100 will store. Thus, more electric energy is available with a high dielectric constant material 50.

Preferred dielectric materials for use in the invention include those found in U.S. patent application Ser. No. 08/911,716 filed August, 1997, entitled SEMICONDUCTOR SUPERCAPACITOR SYSTEM AND METHOD FOR MAKING SAME, herein incorporated by reference. Particularly preferred is a thin film of the formula $Ba_aTi_bO_c$ wherein a and b are independently between 0.75 and 1.25 and c is between about 2.5 and about 5.0.

Another dielectric material 50 that can be used in the invention is a thin film of the formula $M_dBa_aTi_bO_c$ wherein "M" is Au, Cu, $Ni_3Al$, Ru, or InSn, and wherein a and b are independently between 0.75 and 1.25 and c is between about 2.5 to about 5.0 and d is about 0.01 to 0.25.

The conducting substrates 40 and 60 can be an electrical conductor, such as copper as silver. The preferred embodiment would have copper as the electrical conductor, due to the thermal and electrical characteristics it has.

Several thin film deposition techniques can deposit the previously named dielectric on the conducting substrate, such as a sol-gel process, sputtering, or chemical vapor technologies.

Figure 9:
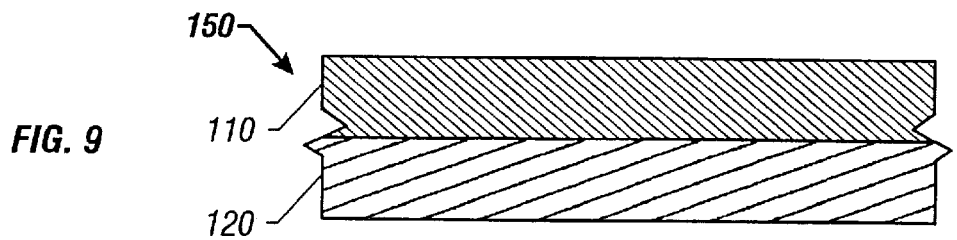
FIG. 9 is a cut away view of a blank printed circuit board.
Figure 10:
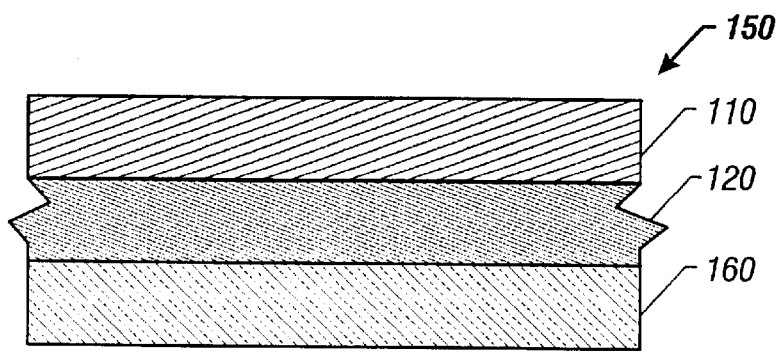
FIG. 10 is a cut away view of a double sided blank printed circuit board.

In yet another embodiment of the invention, the same technology could be used in the manufacture of printed circuit boards. Printed circuit boards typically have the same substrate structure of integrated circuit chips, but the layers have differing compositions for different purposes. As shown in FIG. 9, a printed circuit board 150 contains a top layer of conducting material 110, such as copper, laid over non-conducting layer 120, such as fiberglass. To make the circuit patterns, a photo resist pattern is silkscreened onto conducting layer 110, and board 150 is acid washed. This removes all of conducting material 110 except the portions protected by the silkscreened photo resist. One should note that board 150 can contain a second layer of conducting material 160 on the bottom, as shown in FIG. 10, and the process for making the circuit pattern in this case is the same.

Figure 11:
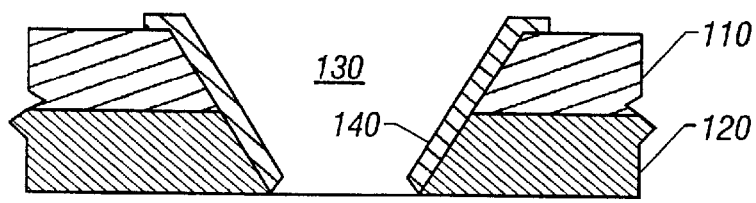
FIG. 11 is a cut away view of a printed circuit board showing a via and its structure.

Thus, circuit board 150 has a makeup such as depicted in FIG. 11, with conducting material 110 overlaying in certain places substrate 120. One drills plate holes 130 in the board for the various discrete electrical components, such as integrated circuit chips, resistors, and capacitors. One then lines hole 130 with electrical conducting material 140, making a "via" for the printed circuit board. This ensures electrical contact between the discrete devices placed on the board in the holes and the etched circuit pattern defined by conducting material 110 on the surface of board 150. This technique can also be used to connect two electrical conducting layers 110 separated by a non-conducting layer 120.

Figure 12:
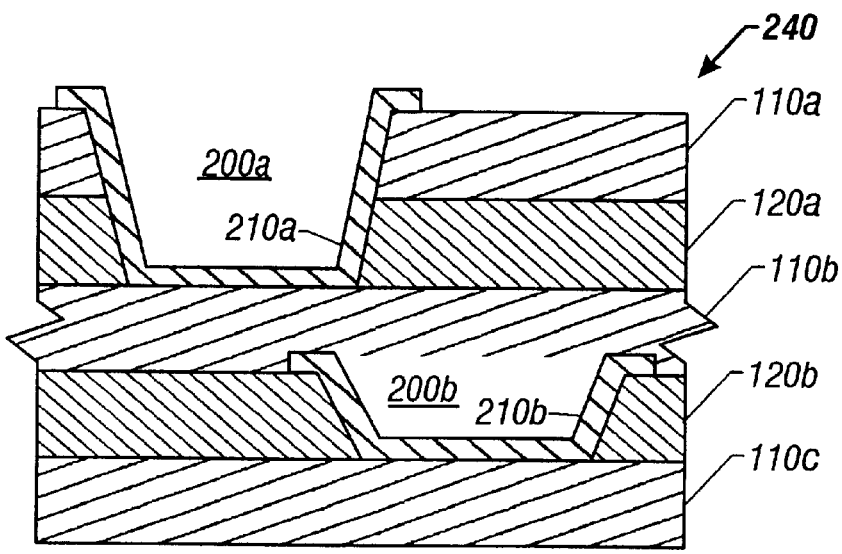
FIG. 12 is a cut away view of a printed circuit board made up of many layers.

One can bond several layers together, and make electrical contacts through one level to another, such as making "vias" through the top board to the second. Thus, one can form multi-layer circuits, as shown by multi-layer board 240, conducting layers 110a, 110b, and 110c, "vias" 200a and 200b, and non-conducting layers 120a, and 120b in FIG. 12.

In the embodiments of the invention dealing with circuit boards, a photo resist silkscreen is laid on conducting material 110 of a board in the shape, area, and place, for the capacitor having a capacitance for a given dielectric constant and dielectric thickness.

Figure 13:
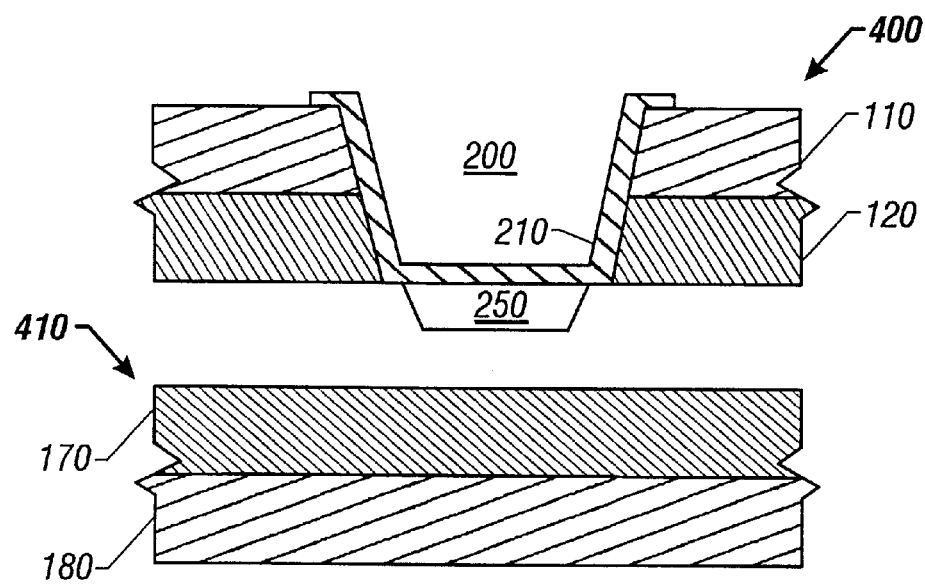
FIG. 13 is a cut away view of an embodiment of the invention showing the structure in a printed circuit board.

FIG. 13 shows conducting layer 110 and nonconducting layer 120 with via 200 connecting layer 110 it to conducting layer 250. One etches or forms electrical conducting layer 250 to form the area and shape required for an electrical energy storage device. A wafer 410 comprising a layer of dielectric material 170 with underlying electrical conducting material 180 is bonded to wafer 400 at shaped conducting layer 250, thus forming an electrical storage device confined within the resulting board.

Figure 13A:
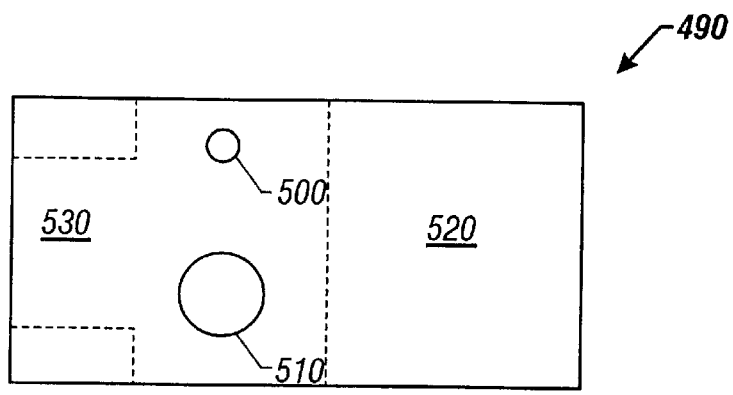
FIG. 13a is a bottom view of an electric assembly in another embodiment of the invention, showing the placement of two electric energy storage device plates and a ghost image of a shaped layer of dielectric material.

Turning to FIG. 13a, the bottom conducting layer of a two sided circuit assembly 490 has been etched to make conducting plates 500 and 510. Non-conducting circuit board layer 520 surrounds conducting plates 500 and 510. Ghost image 530 shows the area on board 490 where a layer of dielectric material 540 will contact board 490. Note that this area includes conducting plates 500 and 510.

Figure 13B:
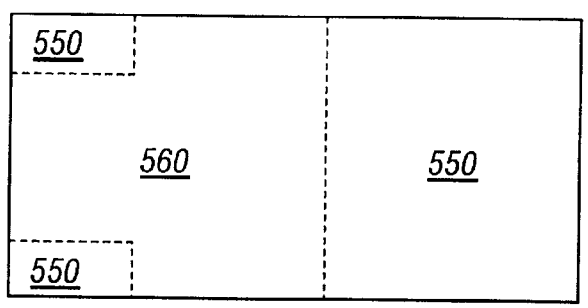
FIG. 13b is a top view of an assembly showing a dielectric layer and a common thermal heat sink comprised of an electrical conductor.

FIG. 13b shows another layered assembly 540 that will be attached to assembly 490. This assembly is made up of a copper heat spreader 550 with an area of a thin film dielectric material 560 placed on it. When attached to assembly 490, conducting plates 500 and 510, together with dielectric volume 540, and copper heat spreader 550 form a pair of capacitors.

It should be noted that one connects conducting plates 500 and 510 to the circuitry on the opposite side of assembly 490 using traditional methods known in the art, such as "vias" which have been discussed previously.

Figure 14:
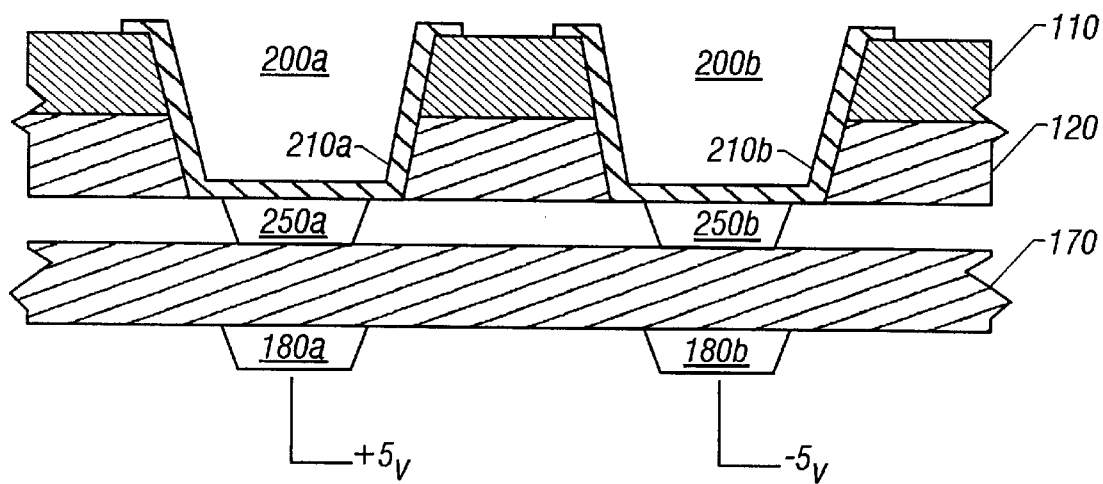
FIG. 14 is a cut away view of another embodiment of the invention showing the structure in a printed circuit board with multiple leads and voltages.

One should note that electrical conducting layer 180 can itself be formed so that one can tie different components to different voltages, as shown in FIG. 14.

FIG. 14 shows electrical layer 180a and electrical layer 180b connected to two possibly different voltages, and also connected to two different electrical inputs through electrical layers 110a and 110b, respectively.

Or, as shown in FIG. 13, electrical conducting layer 180 need not be altered, thus providing a common voltage for all the electrical storage components formed out of electrical conducting layer 110 and dielectric layer 170.

With an appropriately high dielectric constant material comprising dielectric material layer 170, one can make energy storage devices in the interior of the printed circuit board. This greatly reduces the risks of failing interconnections, and saves valuable area on the surface of and volume off the board for more discrete components such as, for example, chips and resistors, to name but a few. The current invention would also serve to reduce the area and volume of a layered electrical device.

In the preferred embodiment, shown in FIG. 13, the resulting circuit board will have an electrical conducting layer 180 that also serves as a heat spreader. Thus, the heat spreader and conducting layer could become a similar voltage level, such as ground, for the components made from dielectric layer 170 and conducting layer 110. One then utilizes the heat spreader to perform double duty, thus increasing the spatial effectiveness of the circuit board.

Figure 15:
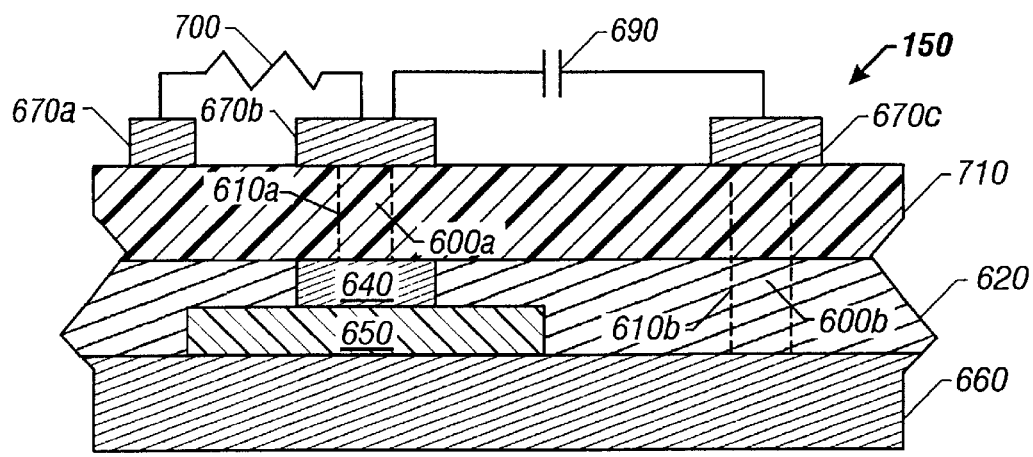
FIG. 15 is a cut away view of an embodiment of the invention disposed within a circuit board.

FIG. 15 shows another embodiment of the present invention disposed within a circuit board. As shown, circuit board 150 comprises a bottom electrode and heat sink 660 upon which insulator 620 is disposed. Within insulator 620 dielectric 650 is disposed such that conducting layer 640 rests in immediate contact with dielectric 650. As shown, conducting plates 610A and 610B define via 600A and 600B such that electrical connections may be maintained through printed circuit laminate 710 such that electrical connections may be maintained at conductive pads 670A, 670B, and 670C. Though not exhaustive of the combinations of circuitry this configuration may provide, circuit board 150 is depicted as an RC (resistive capacitance) circuit comprising resistor 700 and capacitor 690. Those skilled in the art will recognize that this depiction represents one of literally countless permutations that this arrangement can be adapted for specific applications.

Figure 16:
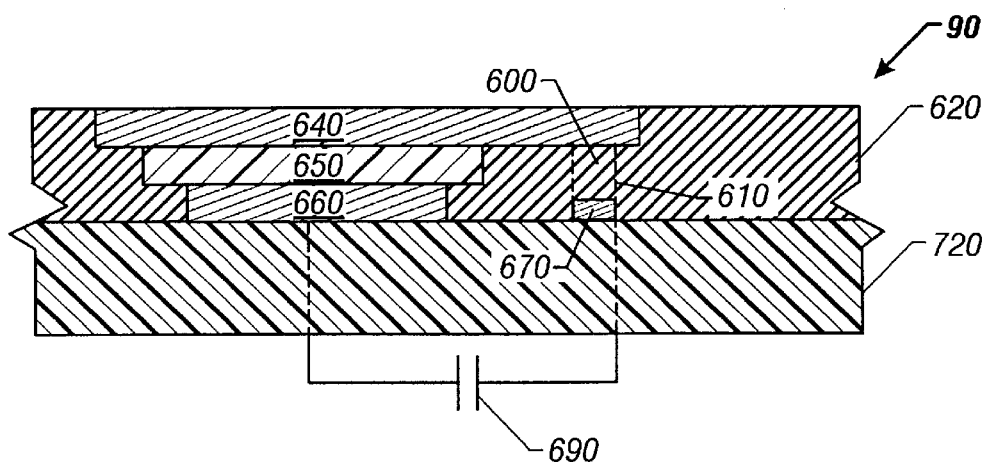
FIG. 16 is a cut away view of another embodiment of the invention disposed within an integrated circuit chip.

Showing another embodiment of the present invention disposed within an integrated circuit chip 90, FIG. 16 shows an arrangement of the present invention an a semiconductor integrated circuit chip 90. As shown, semiconductor chip substrate 720 provides a foundation for bottom electrode 660 that is in direct communication with dielectric 650 wherein top electrode 640 connects to dielectric 650 also. As shown, top electrode 640 electrically connects via the conducting plate 610 that forms via 600 to conducting pad 670. This relationship allows the passage of voltage through semiconductor chip substrate 720 to allow use in electrical applications as shown by example with capacitor 690.

In yet another embodiment of the invention, the interior layered conducting plates and dielectric comprise a battery. When an external power source goes out, an embedded battery made from the conducting plates and the high storage capacity dielectric could provide a back up power source solely contained within either an integrated circuit chip or a printed circuit board.

It should be noted that in all embodiments, the energy storage device will exist as an integral part of the resulting layered electrical device. In the case of a circuit board, the final layered electrical device may have as part of one of its exterior surfaces one of the electrical storage device's conducting layers. In this case, the storage device would be partially embedded in the layered electrical device. In other embodiments, the electrical storage device would be fully embedded within the final layered electrical device.

Various modifications may be made in the nature, composition, operation and arrangement of the various elements, steps and procedures described herein without departing from the spirit and scope of the invention as defined in the following claims.

I claim:

1. An energy storage device at least partially embedded within a layered electrical device, wherein the layered electrical device has a top exterior surface and a bottom exterior surface, the energy storage device comprising:

a dielectric material; and a first and second electrical storage conducting layer, wherein the dielectric material lies between and contacts the electrical storage conducting layers;

wherein the dielectric material exists between the exterior surfaces of the layered electrical device and the first or second electrical storage conducting layer comprise a plurality of electrical conducting elements connected to different voltages.

2. The energy storage device of claim 1 wherein the layered electrical device is a circuit board.

3. The energy storage device of claim 2 wherein the layered electrical device further comprises at least one circuit conducting layer electrically connected to one of the electrical storage conducting layers.

4. The energy storage device of claim 3, wherein the circuit conducting layer is contained within the top and bottom exterior surfaces of the circuit board.

5. The energy storage device of claim 1, wherein the layered electrical device further comprises at least one circuit conducting layer electrically connected to one of the electrical storage conducting layers.

6. The energy storage device of claim 5, wherein the circuit conducting layer comprises at least a portion of either the top or bottom exterior surface of the layered electrical device.

7. The energy storage device of claim 1 wherein the dielectric material has a dielectric constant of at least 50.

8. The energy storage device of claim 1 wherein the dielectric material is of the formula $Ba_aTi_bO_c$ wherein a and b are independently between 0.75 and 1.25 and c is between about 2.5 and about 5.0.

9. The energy storage device of claim 1 wherein the dielectric material is of the formula $M_dBa_aTi_bO_c$ wherein "M" is Au, Cu, $Ni_3Al$, Ru, or InSn, a and b are independently between 0.75 and 1.25, c is between about 2.5 and about 5.0, and d is between 0.01 and 0.25.

10. The energy storage device of claim 1 wherein either the first or second electrical storage conducting layers acts as a thermal heat sink.

11. The energy storage device of claim 1 wherein the energy storage device is a capacitor.

12. The energy storage device of claim 1 wherein the energy storage device is a battery.

13. The energy storage device of claim 1 wherein the layered electrical device is an integrated circuit chip.

14. The energy storage device of claim 13, wherein the integrated circuit chip further comprises at least one circuit conducting layer electrically connected to one of the electrical storage conducting layers.

15. The energy storage device of claim 13, wherein the first and second electrical storage conducting layers are contained within the top and bottom exterior surfaces of the integrated circuit chip.

16. The energy storage device of claim 13 wherein the dielectric material has a dielectric constant of at least 50.

17. The energy storage device of claim 13 wherein the dielectric material is of the formula $Ba_aTi_bO_c$ wherein a and b are independently between 0.75 and 1.25 and c is between about 2.5 and about 5.0.

18. The energy storage device of claim 13 wherein the dielectric material is of the formula $M_dBa_aTi_bO_c$, wherein "M" is Au, Cu, $Ni_3Al$, Ru, or InSn, a and b are independently between 0.75 and 1.25, c is between about 2.5 and about 5.0 and d is between 0.01 and 0.25.

19. The energy storage device of claim 13 wherein either of the electrical storage conducting layers is also a thermal heat sink.

20. The energy storage device of claim 13 wherein either of the electrical storage conducting layers acts as a thermal heat sink.

21. The energy storage device of claim 13 wherein the energy storage device is a backup power source.

22. A circuit board comprising:
a top exterior surface and a bottom exterior surface;
at least one energy storage device comprising:
 a dielectric material; and
 a first and a second electrical storage conducting layers, wherein the dielectric material lies between and contacts the first and second electrical storage conducting layers;
wherein the energy storage device is at least partially embedded between the top exterior surface and bottom exterior surface of the circuit board; and
further wherein the first or second electrical storage conducting later has more than one electrically conducted element connected to different voltages or, having different capacitor values tied to the same voltage.

23. The circuit board of claim 22 wherein the dielectric material has a dielectric constant of at least 50.

24. The circuit board of claim 22 wherein the dielectric material has a dielectric constant of at least 100.

25. The circuit board of claim 22, wherein the circuit board further comprises at least one circuit conducting layer, the circuit conducting layer residing outside of the at least one energy storage device.

26. The circuit board of claim 25 wherein at least one of the electrical conducting layers is electrically connected to the circuit conducting layer.

27. The circuit board of claim 25 wherein at least one of the circuit conducting layers comprises at least a portion of one of the exterior surfaces.

28. The circuit board of claim 22 wherein the dielectric material is of formula the $Ba_aTi_bO_c$ wherein a and b are independently between 0.75 and 1.25 and c is between about 2.5 and about 5.0.

29. The circuit board of claim 22 wherein the dielectric material is of the formula $M_dBa_aTi_bO_c$, wherein "M" is Au, Cu, $Ni_3Al$, Ru, or InSn, a and b are independently between 0.75 and 1.25, c is between about 2.5 and about 5.0, and d is between 0.01 and 0.25.

30. The circuit board of claim 22 wherein the second electrical storage conducting layer is also a thermal heat sink.

31. The circuit board of claim 22 wherein the second electrical conducting layer is common to the at least one electrical storage device at least partially embedded in the board.

32. The circuit board of claim 22 wherein the at least one energy storage device is a capacitor.

33. The circuit board of claim 22 wherein the at least one energy storage device is a battery.

34. An integrated circuit chip comprising:
a top exterior surface and a bottom exterior surface;
at least one energy storage device comprising:
 a dielectric material; and
 a first and a second electrical storage conducting layer, wherein the dielectric material lies between and contacts the first and second electrical storage conducting layers;
wherein the energy storage device is embedded between the top exterior surface and bottom exterior surface of the integrated circuit chip; and
the first or second electrical conducing layer comprises a plurality of electrical conducting elements connected to different voltages.

35. The integrated chip of claim 34, wherein the integrated circuit chip further comprises at least one circuit conducting layer which is exterior to the energy storage device.

36. The integrated circuit chip of claim 35 wherein at least one of the electrical storage conducting layers is electrically connected to said at least one circuit conducting layer.

37. The integrated circuit chip of claim 34 wherein the dielectric material has a dielectric constant of at least 50.

38. The integrated circuit chip of claim 34 wherein the dielectric material has a dielectric constant of at least 100.

39. The integrated circuit chip of claim 34 wherein the dielectric material is of the formula $Ba_aTi_bO_c$ wherein a and b are independently between 0.75 and 1.25 and c is between about 2.5 and about 5.0.

40. The integrated circuit chip of claim 34 wherein the dielectric material is of the formula $M_dBa_aTi_bO_c$, wherein "M" is Au, Cu, $Ni_3Al$, Ru, or InSn, a and b are independently between 0.75 and 1.25, c is between about 2.5 and about 5.0, and d is between 0.01 and 0.25.

41. The integrated circuit chip of claim 34 wherein the second electrical storage conducting layer is also a thermal heat sink.

42. The integrated circuit chip of claim 34 wherein the second electrical conducting layer is common to all the electrical storage devices embedded within the integrated circuit chip.

43. The integrated circuit chip of claim 34 wherein the at least one energy storage device is a capacitor.

44. The integrated circuit chip of claim 34 wherein the at least one energy storage device is a battery.

45. An electrical circuit assembly having multiple energy storage device components which are at least partially embedded within a layered electrical device, wherein the layered electrical device has a top exterior surface and a bottom exterior surface, the energy storage device components comprising:

a dielectric material; and first and second electrical storage conducting layers, wherein the dielectric material lies between and contacts the electrical storage conducting layers;

wherein the dielectric material exists between the exterior surfaces of the layered electrical device; and wherein the first or second electrical storage conducting layer has more than one electrically conducted element connected to different voltages or having different capacitor values tied to the same voltage.

46. The electrical circuit assembly of claim 45 wherein the layered electrical device is a circuit board.

47. The electrical circuit assembly of claim 46 wherein the layered electrical device further comprises at least one circuit conducting layer electrically connected to one of the electrical storage conducting layers.

48. The electrical circuit assembly of claim 4 wherein the circuit conducting layer is contained within the top and bottom exterior surfaces of the circuit board.

49. The electrical circuit assembly of claim 45 wherein the layered electrical device further comprises at least one circuit conducting layer electrically connected to one of the electrical storage conducting layers.

50. The electrical circuit assembly of claim 49 wherein the circuit conducting layer comprises at least a portion of either the top or bottom exterior surface of the layered electrical device.

51. The electrical circuit assembly of claim 45 wherein the dielectric material has a dielectric constant of at least 50.

52. The electrical circuit assembly of claim 45 wherein the dielectric material is of the formula $Ba_aTi_bO_c$ wherein a and b are independently between 0.75 and 1.25 and c is between about 2.5 and about 5.0.

53. The electrical circuit assembly of claim 45 wherein the dielectric material is of the formula $M_dBa_aTi_bO_c$ wherein "M" is Au, Cu, $Ni_3Al$, Ru, or InSn, a and b are independently between 0.75 and 1.25, c is between about 2.5 and about 5.0, and d is between 0.01 and 0.25.

54. The electrical circuit assembly of claim 45 wherein either the first or second electrical storage conducting layers acts as a thermal heat sink.

55. The electrical circuit assembly of claim 45 wherein the energy storage device components function as at least one capacitor.

56. The electrical circuit assembly of claim 45 wherein the energy storage components function as a backup power source.

* * * * *

UNITED STATES PATENT AND TRADEMARK OFFICE
CERTIFICATE OF CORRECTION

PATENT NO. : 6,137,671
DATED : October 24, 2000
INVENTOR(S) : Staffiere, Donald T.

It is certified that error appears in the above-identified patent and that said Letters Patent are hereby corrected as shown below:

In claim 19, before "electrical" and after "wherein", please delete "either of ".

In claim 19, before the end of the claim and after "storage", please delete "conducting layers is also a thermal heat sink" and insert therefor --device is a capacitor--.

In claim 48, before "wherein" and after "claim", please delete "4" and insert therefor --47--.

Signed and Sealed this

Eighth Day of May, 2001

NICHOLAS P. GODICI

*Attest:*

*Attesting Officer*    Acting Director of the United States Patent and Trademark Office